US008987989B2

(12) United States Patent
Shin et al.

(10) Patent No.: US 8,987,989 B2
(45) Date of Patent: Mar. 24, 2015

(54) ORGANIC LIGHT-EMITTING DISPLAY DEVICE AND INPUT PAD THEREOF (75) Inventors: Hye-Jin Shin, Gyunggi-Do (KR); Won-Kyu Kwak, Gyunggi-Do (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 225 days.

(21) Appl. No.: 13/137,470

(22) Filed: Aug. 18, 2011

(65) Prior Publication Data

US 2012/0153813 A1    Jun. 21, 2012

(30) Foreign Application Priority Data

Dec. 16, 2010   (KR) .................. 10-2010-0129288

(51) Int. Cl.
*H05B 33/04*   (2006.01)
*H01L 27/32*   (2006.01)

(52) U.S. Cl.
CPC ......... *H01L 27/3276* (2013.01); *H01L 27/3223* (2013.01)
USPC ........................................ 313/512; 174/260

(58) Field of Classification Search
USPC ........................................ 313/512; 174/260
See application file for complete search history.

(56) References Cited

U.S. PATENT DOCUMENTS

| 2001/0045565 | A1* | 11/2001 | Yamazaki ...................... 257/89 |
| 2002/0000773 | A1* | 1/2002 | Kanno et al. .................. 313/504 |
| 2003/0137325 | A1* | 7/2003 | Yamazaki et al. .............. 327/80 |
| 2005/0012454 | A1* | 1/2005 | Yamazaki et al. ............ 313/506 |
| 2005/0184656 | A1* | 8/2005 | Kim et al. ...................... 313/504 |
| 2005/0206308 | A1* | 9/2005 | Takahashi et al. ............ 313/504 |
| 2005/0212413 | A1* | 9/2005 | Matsuura et al. ............. 313/504 |
| 2006/0113903 | A1* | 6/2006 | Kim ............................... 313/506 |
| 2009/0102364 | A1  | 4/2009 | Suh et al. |

FOREIGN PATENT DOCUMENTS

| JP | 2006-100307 A | 4/2006 |
| KR | 10-0449180 B1 | 7/2004 |
| KR | 10-2009-0040658 A | 4/2009 |

* cited by examiner

*Primary Examiner* — Andrew Coughlin
(74) *Attorney, Agent, or Firm* — Lee & Morse, P.C.

(57) ABSTRACT

An organic light-emitting display device includes a plurality of pixels on a substrate, and input pads coupled to the plurality of pixels through wirings, the input pads being connected to a circuit board, wherein each of the input pads includes an extension portion extending from a respective wiring, a connection portion separated from the extension portion by a predetermined distance and connected to the circuit board, a resistance portion contacting the extension portion and the connection portion, and a dummy portion on the resistance portion and contacting the connection portion, the dummy portion being insulated from the extension portion.

19 Claims, 6 Drawing Sheets

ORGANIC LIGHT-EMITTING DISPLAY DEVICE AND INPUT PAD THEREOF

CROSS-REFERENCE TO RELATED PATENT APPLICATION

This application claims the benefit of Korean Patent Application No. 10-2010-0129288, filed on Dec. 16, 2010, in the Korean Intellectual Property Office, the disclosure of which is incorporated herein in its entirety by reference.

BACKGROUND

1. Field

Example embodiments relate to an organic light-emitting display device that prevents damage caused by static electricity and an input pad used in the organic light-emitting display device.

2. Description of the Related Art

Organic light-emitting display devices have drawn attention as next generation display devices because they have superior characteristics, e.g., wide viewing angles, high contrast, short response times, and low power consumption, as compared to liquid crystal display (LCD) devices. In addition, the organic light-emitting display devices do not require a backlight unit, thereby having reduced weight and thickness, e.g., as compared to the LCD devices. An organic light-emitting display device includes a substrate that provides a pixel area and a non-pixel area, and a container or an encapsulation substrate that is disposed to face the substrate for encapsulation and is aligned with the substrate by a sealant, e.g., epoxy.

In the organic light-emitting display device, the substrate is formed of glass or the like. Thus, a large amount of static electricity may be generated when the organic light-emitting display device is manufactured or used.

SUMMARY

According to an aspect of the example embodiments, there is provided an organic light-emitting display device that includes a plurality of pixels on a substrate, and input pads coupled to the plurality of pixels through wirings, the input pads being connected to a circuit board. Each of the input pads may include an extension portion extending from a respective wiring, a connection portion separated from the extension portion by a predetermined distance and connected to the circuit board, a resistance portion contacting the extension portion and the connection portion, and a dummy portion on the resistance portion and contacting the connection portion, the dummy portion being insulated from the extension portion.

The organic light-emitting display device may further include an insulating layer on the dummy portion, wherein the resistance portion contacts the extension portion through first contact holes in the insulating layer and contacts the connection portion through second contact holes in the insulating layer, and wherein the dummy portion contacts the connection portion through third contact holes in the insulating layer.

Each of the first contact holes may correspond to a first edge portion of the resistance portion, each of the second contact holes may correspond to a second edge portion of the resistance portion, and the first and second edge portions of the resistance portion may be opposite each other.

The first contact holes may be adjacent to each other along a first direction, the second contact holes may be adjacent to each other along the first direction, and each of the first and second edge portions may extend along the first direction.

The third contact holes may be disposed between the first contact holes and the second contact holes, the third contact holes being adjacent to the second contact holes.

The third contact holes may be adjacent to each other along the first direction.

The dummy portion may have a relatively larger electrical conductivity than that of the resistance portion.

The resistance portion may include polysilicon.

The dummy portion may include metal.

The organic light-emitting display device may further include a source driving unit and a data driving unit connected between the wirings and the pixels.

The circuit board may be a flexible printed circuit (FPC) board.

The input pads may be disposed at an edge of the substrate.

According to an aspect of the example embodiments, there is provided an input pad including an extension portion, a connection portion separated from the extension portion by a predetermined distance, a resistance portion contacting the extension portion and the connection portion, and a dummy portion on the resistance portion and contacting the connection portion, the dummy portion being insulated from the extension portion.

Each of the first contact holes may correspond to a first edge portion of the resistance portion, each of the second contact holes may correspond to a second edge portion of the resistance portion, and the first and second edge portions of the resistance portion may be opposite each other.

The first contact holes may be adjacent to each other along a first direction, the second contact holes may be adjacent to each other along the first direction, and each of the first and second edge portions may extend along the first direction.

The third contact holes may be disposed between the first contact holes and the second contact holes, the third contact holes being adjacent to the second contact holes.

The third contact holes may be adjacent to each other along the first direction.

The dummy portion may have a relatively larger electrical conductivity than that of the resistance portion.

The resistance portion may include polysilicon, and the dummy portion may include metal.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

As the invention allows for various changes and numerous embodiments, particular embodiments will be illustrated in the drawings and described in detail in the written description. However, this is not intended to limit the example embodiments to particular modes of practice, and it is to be appreciated that all changes, equivalents, and substitutes that do not depart from the spirit and technical scope of the example embodiments are encompassed in the example embodiments. In the description of the example embodiments, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the example embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The example embodiments will now be described more fully with reference to the accompanying drawings.

Figure 1:
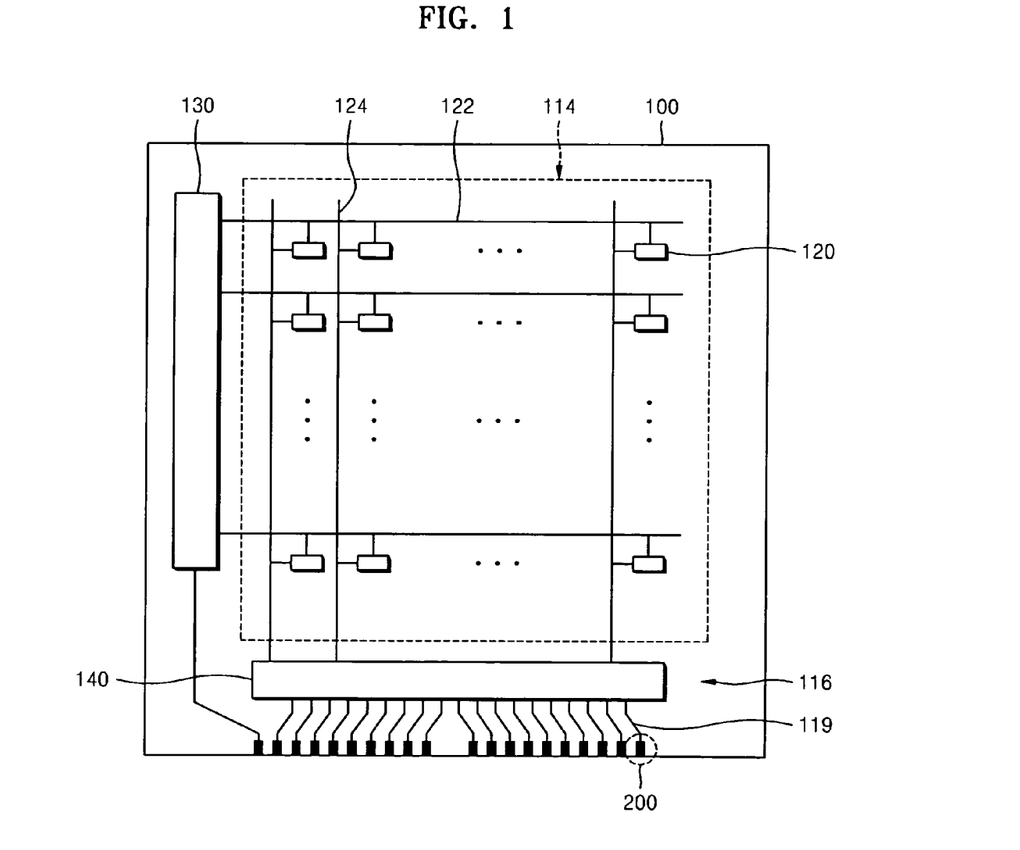
FIG. 1 illustrates a schematic view of an organic light-emitting display device according to an embodiment.

FIG. 1 is a schematic view of an organic light-emitting display device according to an embodiment. Referring to FIG. 1, a plurality of pixels 120 are arranged in a pixel area 114 of a substrate 100. Each of the plurality of pixels 120 includes an organic light-emitting diode that emits light according to current. Also, each pixel 120 may include a driving transistor for driving the organic light-emitting diode, a switching transistor, a storage capacitor, and the like. The structure of the pixel 120 is described in more detail as follows with reference to FIG. 2.

Scanning lines 122 formed in a row direction, i.e., a first direction, to transmit scanning signals and data lines 124 formed in a column direction, i.e., a second direction, to transmit data signals are arranged in the pixel area 114. Although not shown, a source voltage supply line is connected to each of the pixels 120. Thus, the scanning signals, the data signals, and source voltages are applied to the pixel area 114 so that the organic light-emitting diode emits light and an image is displayed.

Extensions of the scanning lines 122 and the data lines 124 that respectively extend from the scanning lines 122 and the data lines 124 in the pixel area 114 and source voltage supply lines are arranged in the non-pixel area 116. A scanning driving unit 130 that applies the scanning signals to the scanning lines 122 and a data driving unit 140 that applies the data signals to the data lines 124 are disposed in the non-pixel area 116. Various types of signals are supplied to the scanning driving unit 130 and the data driving unit 140 from a circuit board 300 (see FIG. 5) through input pads 200. The structure of the input pads will be described in more detail below with reference to FIGS. 3-4.

The scanning driving unit 130 and the data driving unit 140 may be directly formed on the substrate 100 in the non-pixel area 116, when the organic light-emitting display device is manufactured. However, example embodiments are not limited thereto, and the scanning driving unit 130 and the data driving unit 140 may be attached to the substrate 100 by using chip on glass (COG), wire bonding, or the like after the scanning driving unit 130 and the data driving unit 140 are manufactured as a separate integrated circuit (IC) semiconductor chip.

Figure 2:
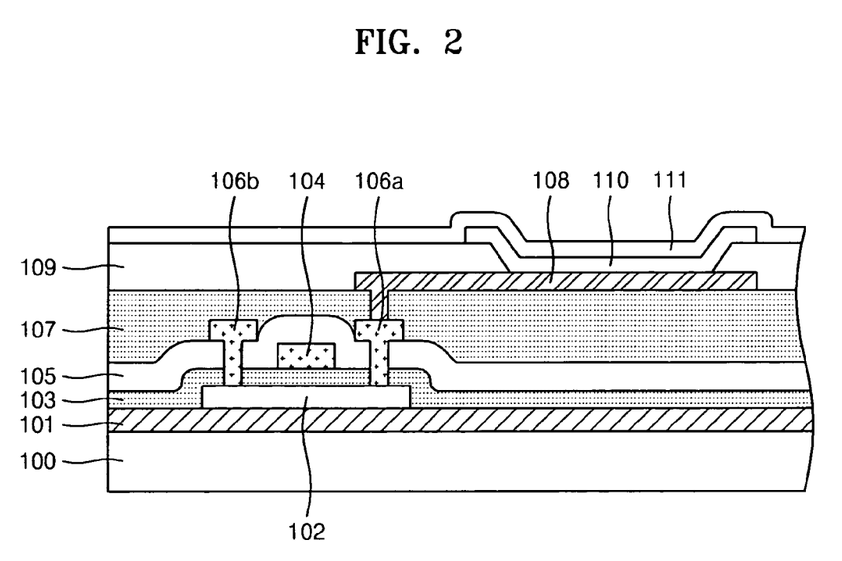
FIG. 2 illustrates a cross-sectional view of a structure of a pixel of the organic light-emitting display device illustrated in FIG. 1.

FIG. 2 is a cross-sectional view of the pixel 120 illustrated in FIG. 1. For convenience of explanation, only a driving transistor, including a gate electrode 104 and source and drain electrodes 106a and 106b, and an organic light-emitting diode, including a pixel electrode 108, a thin organic layer 110, and an opposite electrode 111, are included in the pixel 120. The example embodiments are not limited to FIG. 2, and various types of electronic devices for driving an organic light-emitting diode may be included in the pixel 120.

Referring to FIG. 2, a buffer layer 101 is formed on the substrate 100, and a semiconductor layer 102 for providing an active layer is formed on the buffer layer 101. The semiconductor layer 102 provides source and drain regions and a channel region of a thin-film transistor (TFT). A gate insulating layer 103 is formed on the entire upper surface of the pixel 120 including the semiconductor layer 102, and a gate electrode 104 is formed on the gate insulating layer 103 formed on the semiconductor layer 102. An interlayer insulating layer 105 is formed on the entire upper surface of the pixel 120 including the gate electrode 104, and contact holes are formed in the interlayer insulating layer 105 and the gate insulating layer 103 so as to expose a predetermined portion of the semiconductor layer 102. Source and drain electrodes 106a and 106b are formed on the interlayer insulating layer 105 to be electrically connected to the semiconductor layer 102 through the contact holes, and a planarization layer 107 is formed on the entire upper surface of the pixel 120 including the source and drain electrodes 106a and 106b. A via hole is formed in the planarization layer 107 so as to expose the source or drain electrode 106a or 106b, and a pixel electrode 108 is formed on the planarization layer 107 so as to be electrically connected to the source or drain electrode 106a or 106b through the via hole. Also, a pixel defining layer 109 for exposing the pixel electrode 108 in an emission area is formed on the planarization layer 107, and the thin organic layer 110 and the opposite electrode 111 are formed on the exposed pixel electrode 108. The thin organic layer 110 may be formed of a structure in which a hole transport layer (HTL), an organic emission layer, and an electron transport layer (ETL) are stacked sequentially and may further include a hole injection layer (HIL) and an electron injection layer (EIL).

Figure 3:
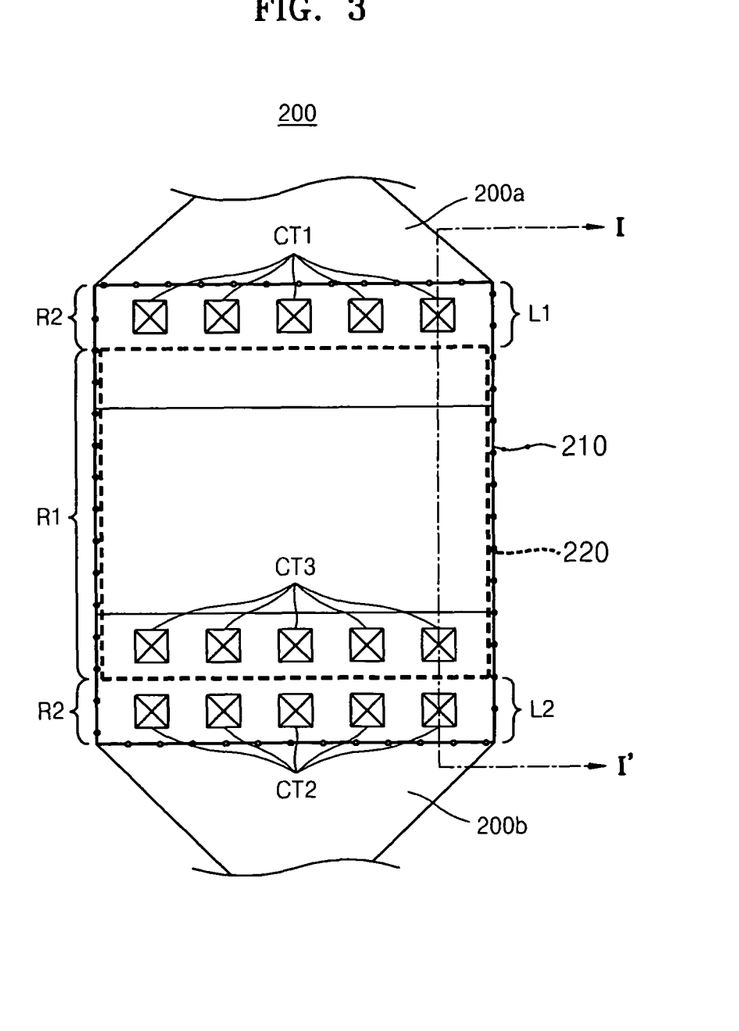
FIG. 3 illustrates a schematic view of an input pad according to an embodiment.
Figure 4:
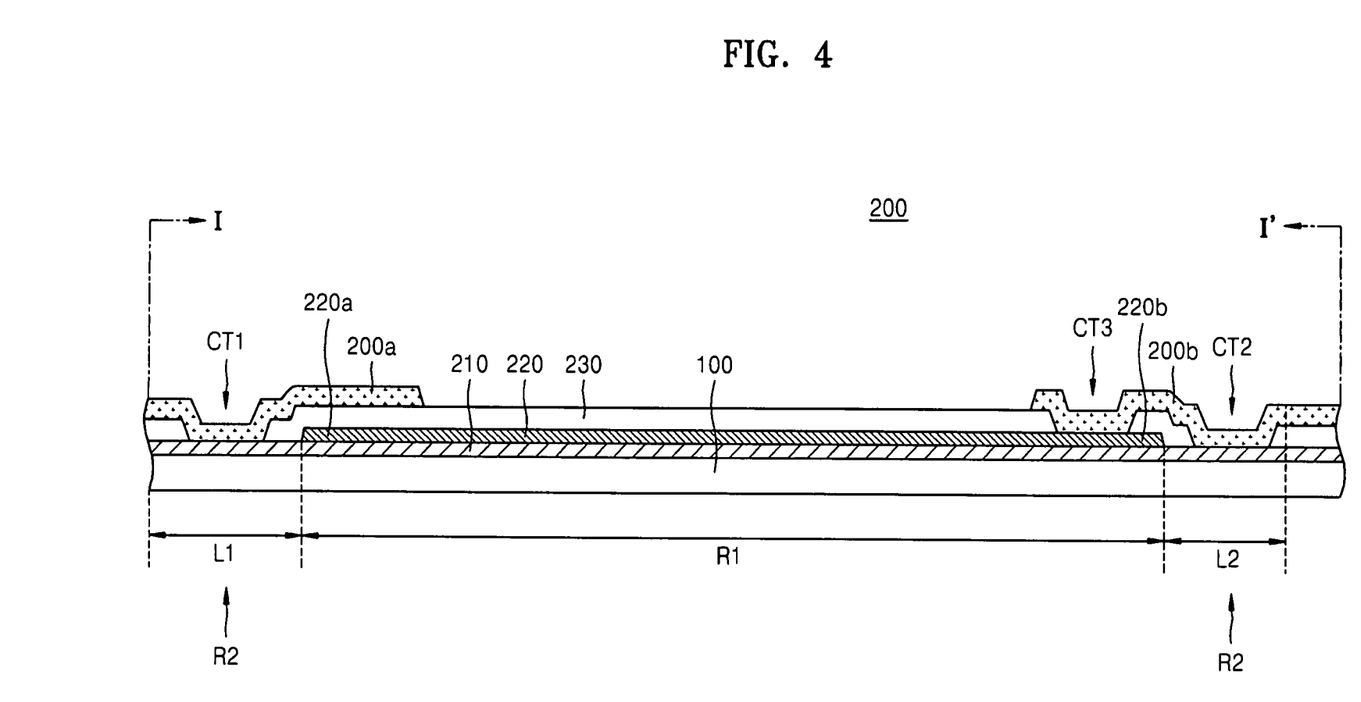
FIG. 4 illustrates a cross-sectional view of the input pad taken along line I-I' of FIG. 3.

FIG. 3 is a schematic view of the input pad 200 according to an embodiment, and FIG. 4 is a cross-sectional view of the input pad 200 along line I-I' of FIG. 3. It is noted that FIGS. 3-4 illustrate an enlarged view of the encircled input pad 200 in FIG. 1.

As illustrated in FIG. 1, a plurality of input pads 200 are disposed at an edge of the substrate 100 to be separated from each other by a predetermined distance. One end of each of the input pads 200 is connected to the scanning driving unit 130 or the data driving unit 140 through wirings 119. The other end of each of the input pads 200 is connected to a circuit board 300 (FIG. 5) that is provided from the outside.

Referring to FIGS. 3 and 4, each input pad 200 includes an extension portion 200a that extends from the wirings 119 connected to the scanning driving unit 130 or the data driving unit 140, a connection portion 200b separated from the extension portion 200a by a predetermined distance and connected to the circuit board 300, a resistance portion 210 having one side contacting the extension portion 200a and the other side contacting the connection portion 200b, a dummy portion 220 formed in a first region R1 of the resistance portion 210 and having one side insulated from the extension portion 200a and the other side contacting the connection portion 200*b*, and an insulating layer 230 formed in a second region R2 of the resistance portion 210.

Referring to FIG. 4, the resistance portion 210 is formed on the substrate 100 by using doped polysilicon to have a predetermined resistance value. The resistance portion 210 may be formed of the same material as the material used to form the semiconductor layer 102 illustrated in FIG. 2.

The dummy portion 220 is formed on, e.g., only on, the first region R1 of the resistance portion 210 by using metal to have a relatively larger electrical conductivity than that of the resistance portion 210. The dummy portion 220 may be formed of the same material as the material used to form the source and drain electrodes 106*a* and 106*b*, the gate electrode 104, the pixel electrode 108, or the opposite electrode 111 illustrated in FIG. 2. The first region R1 of the resistance portion 210 refers to a central region that does not include a first edge portion L1 on a top surface of the resistance portion 210 and a second edge portion L2 disposed at a position opposite to the first edge portion L1. The second region R2 of the resistance portion 210 refers to other regions except for the first region R1 on the top surface of the resistance portion 210, which means upper and lower edge regions of FIG. 3, i.e., portions including the first edge portion L1 and the second edge portion L2 of the resistance portion 210.

The insulating layer 230 is formed on an upper portion of the dummy portion 220, e.g., to completely cover the dummy portion 220, and in the second region R2 of the resistance portion 210 that is not covered by the dummy portion 220 and is exposed to the outside. The insulating layer 230 may be formed of the same material as the material used to form the gate insulating layer 103 and/or the material used to form the interlayer insulating layer 105 of FIG. 2. First contact holes CT1, second contact holes CT2, and third contact holes CT3 are formed in the insulating layer 230.

The first contact holes CT1 are formed in the insulating layer 230 in a region corresponds to the first edge portion L1 of the resistance portion 210. The first contact holes CT1 expose the first edge portion L1 of the resistance portion 210, e.g., a portion of an upper surface of the resistance portion 210. The second contact holes CT2 are formed in the insulating layer 230 in a region that corresponds to the second edge portion L2 of the resistance portion 210, so the second edge portion L2 of the resistance portion 210 is exposed through the second contact holes CT2. The third contact holes CT3 are formed between the first contact holes CT1 and the second contact holes CT2, i.e., the third contact holes CT3 are formed in the insulating layer 230 in a region that corresponds to the first region R1 adjacent to the second edge portion L2 of the resistance portion 210, so a portion of the first region R1 of the resistance portion 210 is exposed. That is, the third holes CT3 are formed to expose an edge of the dummy portion 220 in the first region R1.

A plurality of first contact holes CT1, a plurality of second contact holes CT2, and a plurality of third contact holes CT3 may be formed. Referring to FIG. 3, the plurality of first contact holes CT1 may be disposed in rows along a direction in which the first edge portion L1 extends. Also, the plurality of second contact holes CT2 and the plurality of third contact holes CT3 may be disposed in rows along a direction in which the first edge portion L1 extends. In FIG. 3, five first contact holes CT1, five second contact holes CT2, and five third contact holes CT3 are disposed in a row. However, example embodiments are not limited thereto. Any suitable number of contact holes may be formed, so a plurality of first contact holes CT1, a plurality of second contact holes CT2, and/or a plurality of third contact holes CT3 may be disposed in two or more rows.

The extension portion 200*a* and the connection portion 200*b* are connected to both end portions (first edge portion L1 and second edge portion L2) of the resistance portion 210 through the first contact holes CT1 and the second contact holes CT2 formed in the insulating layer 230. The extension portion 200*a* contacts the first edge portion L1 of the resistance portion 210 exposed through the first contact holes CT1. The connection portion 200*b* contacts the second edge portion L2 of the resistance portion 210 exposed through the second contact holes CT2 and contacts a portion of the dummy portion 220 exposed through the third contact holes CT3. The connection portion 200*b* contacts an edge of the dummy portion 220 that is exposed by the third holes CT3 and overlaps the connection portion 200*b*. It is noted that a first end 220*a* of the dummy portion 220 overlaps the extension portion 200*a*, and a second end 220*b* of the dummy portion 220, i.e., an end opposite the first end, overlaps the connection portion 200*b*. While the second end 220*b* of the dummy portion 220 contacts, e.g., directly contacts, the connection portion 200*b*, the first end 220*a* of the dummy portion 220 is insulated from the extension portion 200*a* by the insulating layer 230.

As example embodiments include a plurality of first through third contact holes CT1 through CT3, a number of contacts between the extension portion 200*a* and the resistance portion 210 and/or between the connection portion 200*b* and the dummy portion 220 is large. When the number of contacts increases, static electricity flows in the resistance portion 210 and the dummy portion 220 through the extension portion 200*a* or the connection portion 200*b*.

Figure 5:
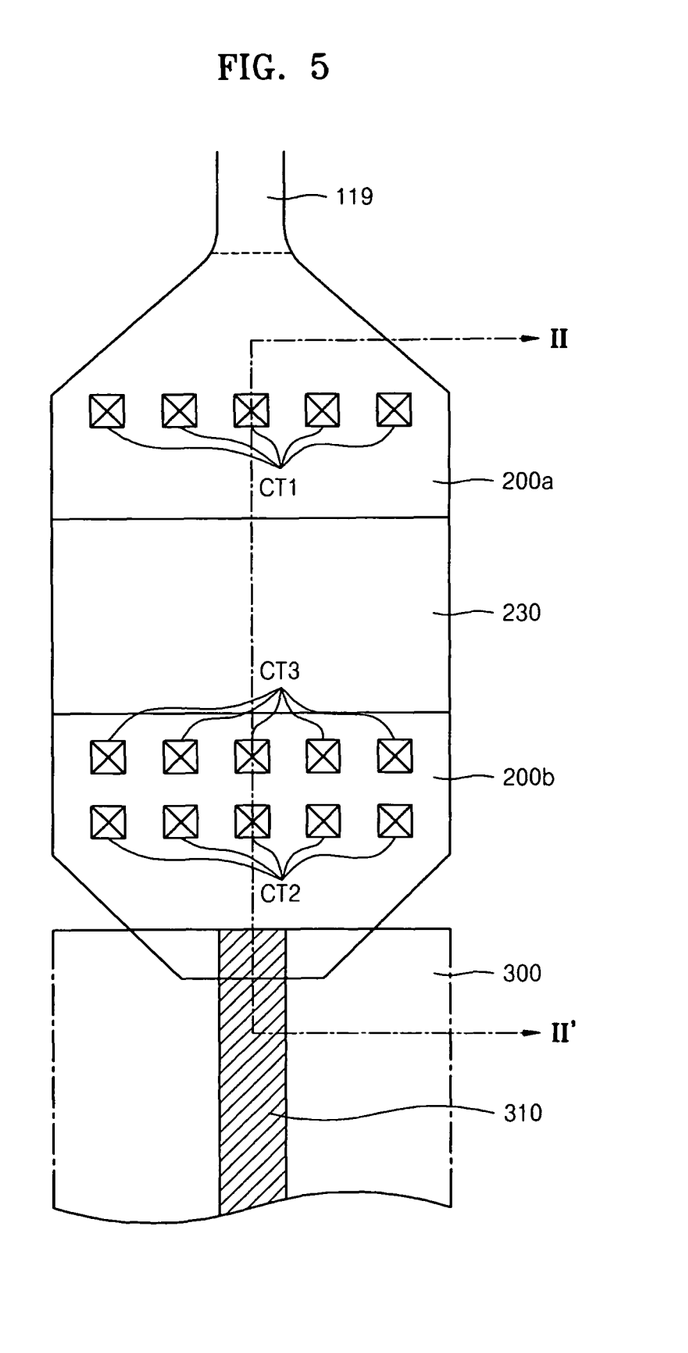
FIG. 5 illustrates a schematic view of a connection between a circuit board and an input pad according to an embodiment.

Also, the extension portion 200*a* of the input pad 200 has a larger width than that of the wirings 119 and a larger area than that of the wirings 119 (see FIG. 5). Thus, even when a portion of static electricity that flows in the dummy portion 220 flows in the extension portion 200*a*, the static electricity is discharged at the extension portion 200*a* having a larger width and does not continue to flow in the wirings 119.

In the organic light-emitting display device, the input pad 200 is disposed at an edge of the substrate 100, so static electricity easily flows in the input pad 200. However, the input pad 200 according to example embodiments may prevent the static electricity from flowing in the driving unit, the pixel area 114, and the circuit board 300 of the organic light-emitting display device, thereby preventing damage thereto. In detail, since the input pad 200 includes the dummy portion 220 on the resistance portion 210, damage to the resistance portion 210 may be prevented even when an excessive amount of static electricity flows in the input pad 200. In other words, when an excessive amount of static electricity flows in the input pad 200, the static electricity is divided and flows in two places, i.e., the resistance portion 210 and the dummy portion 220 formed on the resistance portion 210. In other words, even when a total amount of static electricity through the input pad 200 is excessive, a total amount of static electricity through each of the resistance portion 210 and dummy portion 220 is lower than the total amount through the entire input pad 200. Therefore, as the amount of static electricity through the resistance portion 210 is lowered, i.e., not excessive, the resistance portion 210 is not burnt or does not cause a short circuit.

In contrast, if a dummy portion 220 is not formed on the resistance portion 210, an excessive amount of static electricity in the input pad 200 may flow through the resistance portion 210, thereby, e.g., instantaneously, increasing current through the input pad 200 and causing a short circuit or malfunction, e.g., the resistance portion 210 having a relatively lower rigidity, compared to metal, may be burnt or cause a short circuit. Therefore, static electricity that flows in the dummy portion 220 according to example embodiments is discharged at the dummy portion 220 or is transferred to the extension portion 220a. Static electricity transferred to the extension portion 200a is discharged at the extension portion 200a having a large area in comparison to that of a related art input pad, so that static electricity can be prevented from flowing in various types of driving units, the pixel area 114, and the circuit board 300 of the organic light-emitting display device.

Figure 6:
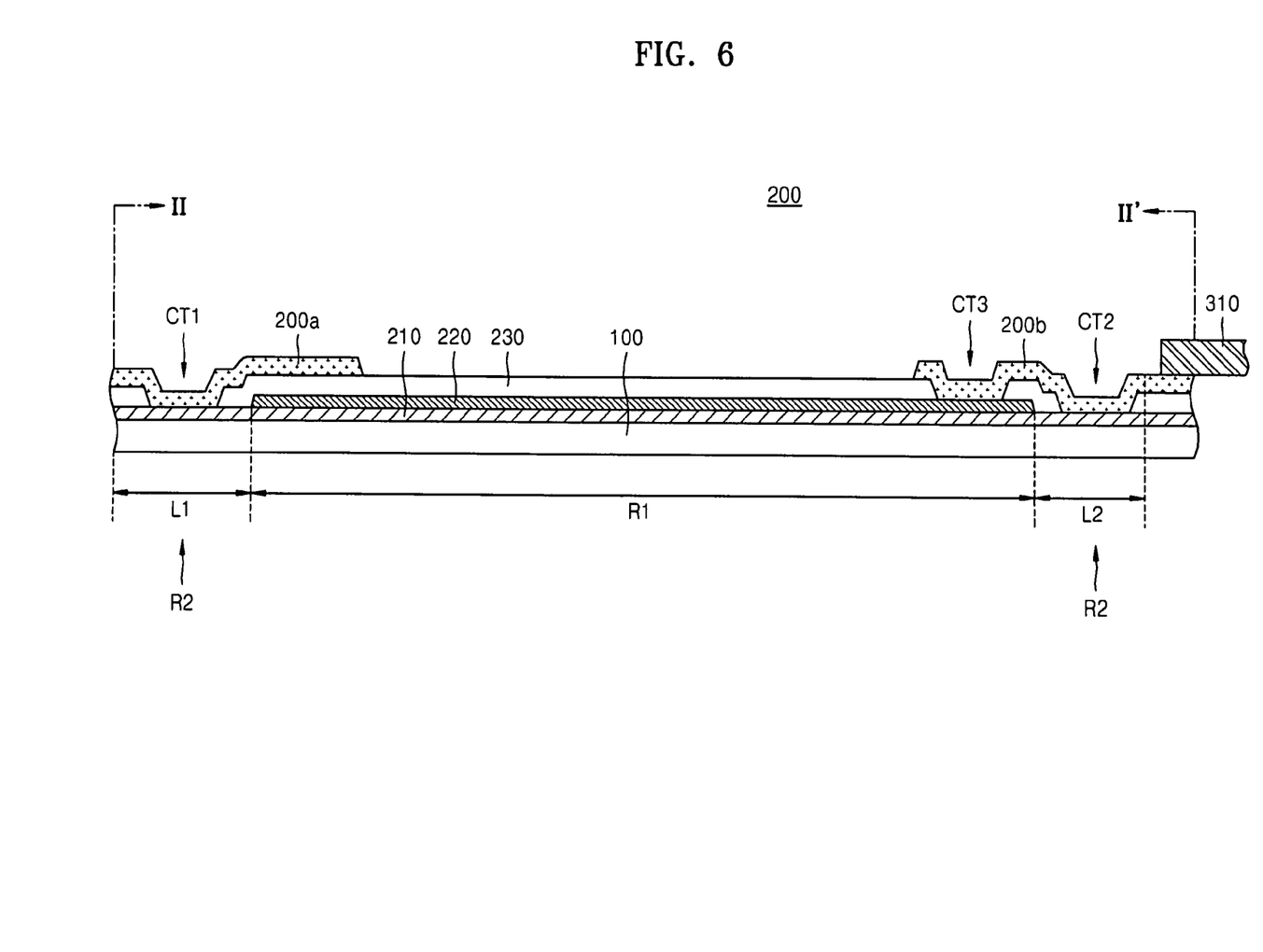
FIG. 6 illustrates a cross-sectional view taken along line II-II' of FIG. 5.

FIG. 5 is a schematic view of a case where the circuit board 300 disposed outside the input pad 200 is connected to the input pad 200 according to an embodiment. FIG. 6 is a cross-sectional view taken along line II-II' of FIG. 5.

In FIGS. 5 and 6, a pad 310 of the circuit board 300 is connected to the connection portion 200b of the input pad 200. The circuit board 300 is a flexible printed circuit (FPC) board having the form of a film. Various types of signals are supplied to the input pad 200 from the circuit board 300. For example, the various types of signals may be driving control signals for driving the scanning driving unit 130 and the data driving unit 140, power for driving, and the like.

When various types of signals are applied to the scanning driving unit 130 and the data driving unit 140 from the circuit board 300 through the input pad 200, the scanning driving unit 130 and the data driving unit 140 apply scanning signals and data signals to the pixel area 114. In the pixel area 114, an organic light-emitting diode of the pixel 120 selected in response to the scanning signals emits light.

Referring to FIG. 5, the extension portion 200a of the input pad 200 extends from the wirings 119. Also, the width of the extension portion 200a of the input pad 200 may be larger than that of the wirings 119. Thus, even when some static electricity that flows in the dummy portion 220 flows in the extension portion 200a, the static electricity is discharged at the extension portion 200a having a large area, e.g., in comparison to conventional input pads, and does not continue to flow in the wirings 119. It is noted that the widths of the extension portion 200a and the wirings 119 is measured along the first direction, i.e., a direction parallel to a virtual line connecting a plurality of first contact holes CT1, substantially perpendicular to the second direction, i.e., a direction parallel to a virtual line connecting the wiring 119 and the pad 310.

The input pad 200 may effectively prevent static electricity from flowing in the scanning driving unit 130 and the data driving unit 140 from the circuit board 300 through the input pad 200 when the circuit board 300 is not connected to the input pad 200, i.e., by forming the resistance portion 210 and the dummy portion 220 as illustrated in FIGS. 3 and 4. Also, the input pad 200 may effectively prevent static electricity from flowing in the scanning driving unit 130 and the data driving unit 140 from the circuit board 300 through the input pad 200 when the circuit board 300 is connected to the input pad 200, i.e., by forming the resistance portion 210 and the dummy portion 220 as illustrated in FIGS. 5 and 6. Thus, the flow of high current due to static electricity is prevented, and only a valid signal, e.g., a driving control signal, is supplied to the organic light-emitting display device so that a driving circuit and the organic light-emitting diode may be safely protected.

As described above, the resistance portion 210 and the dummy portion 220 may be formed for all of the input pads 200 or some of the input pads 200. Also, the input pad 200 may be used in the organic light-emitting display device or in various display devices, e.g., a liquid crystal display (LCD) device, a plasma display device, an electrophoresis display device, and the like.

According to example embodiments described above, a resistance portion and a dummy portion are formed in an input pad of an organic light-emitting display device. Therefore, the flow of an overcurrent caused by static electricity flowing through a substrate or a circuit board that is provided from the outside may be prevented or substantially minimized. Specifically, the resistance portion has one side contacting an extension portion and the other side contacting a connection portion separated from the extension portion by a predetermined distance, and the dummy portion is formed on the resistance portion and contacting the connection portion. Therefore, static electricity may be effectively divided between the resistance portion and the dummy portion, and the static electricity flowing through the dummy portion may be effectively discharged and prevented from flowing in the substrate or the circuit board.

As such, the input pad, i.e., the resistance portion, is prevented from causing a short circuit or being burnt due to excessive static electricity. That is, according to example embodiments, when an excessive amount of static electricity flows in the input pad, the resistance portion having relatively lower rigidity compared to metal may be prevented from being burnt or from causing a short circuit by diverting a portion of the static electricity via the dummy portion. As such, static electricity may be more effectively controlled.

In contrast, when excessive static electricity flows in a conventional display device, i.e., an organic light-emitting diode, or a driving circuit that operates at a low voltage and at a high speed, malfunctions may occur in the organic light-emitting diode or the driving circuit, or the organic light-emitting diode or the driving circuit may be damaged due to an electrical effect. That is, when static electricity generated outside the driving circuit flows in the driving circuit through a wiring installed inside the organic light-emitting display device, an operation of the driving circuit may stop momentarily. When a number of occurrences of static electricity or voltage increases, a circuit wiring may be disconnected or an electrical short circuit may occur. Damage by static electricity may become more severe as the driving circuit is gradually highly integrated (as the size of the driving circuit is reduced).

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:
1. An organic light-emitting display device, comprising:
a plurality of pixels on a substrate; and
input pads coupled to the plurality of pixels through wirings, the input pads being connected to a circuit board, wherein each of the input pads includes:
an extension portion extending from a respective wiring,
a connection portion separated from the extension portion by a predetermined distance and connected to the circuit board,
a resistance portion, directly disposed on a surface of a substrate of the input pads, contacting the extension portion and the connection portion, and
a dummy portion on the resistance portion and contacting the connection portion, the dummy portion being insulated from the extension portion, wherein the dummy portion has a larger electrical conductivity than that of the resistance portion, wherein the dummy portion is on top of the resistance portion.

2. The organic light-emitting display device as claimed in claim 1, further comprising
an insulating layer on the dummy portion,
wherein the resistance portion contacts the extension portion through first contact holes in the insulating layer and contacts the connection portion through second contact holes in the insulating layer, and wherein the dummy portion contacts the connection portion through third contact holes in the insulating layer.

3. The organic light-emitting display device as claimed in claim 2, wherein each of the first contact holes corresponds to a first edge portion of the resistance portion, each of the second contact holes corresponds to a second edge portion of the resistance portion, and the first and second edge portions of the resistance portion being opposite each other.

4. The organic light-emitting display device as claimed in claim 3, wherein the first contact holes are adjacent to each other along a direction in which the first edge portion extends, and the second contact holes are adjacent to each other along a direction in which the second edge portion extends.

5. The organic light-emitting display device as claimed in claim 4, wherein the third contact holes are disposed between the first contact holes and the second contact holes, the third contact holes being adjacent to the second contact holes.

6. The organic light-emitting display device as claimed in claim 5, wherein the third contact holes are adjacent to each other along a direction in which either the first edge portion or the second edge portion extends.

7. The organic light-emitting display device as claimed in claim 1, wherein the resistance portion includes polysilicon.

8. The organic light-emitting display device as claimed in claim 1, wherein the dummy portion includes metal.

9. The organic light-emitting display device as claimed in claim 1, further comprising a source driving unit and a data driving unit connected between the wirings and the pixels.

10. The organic light-emitting display device as claimed in claim 1, wherein the circuit board is a flexible printed circuit (FPC) board.

11. The organic light-emitting display device as claimed in claim 1, wherein the input pads are disposed at an edge of the substrate.

12. An input pad, comprising:
an extension portion;
a connection portion separated from the extension portion by a predetermined distance;
a resistance portion, directly disposed on a surface of a substrate of the input pad, contacting the extension portion and the connection portion; and
a dummy portion on the resistance portion and contacting the connection portion, the dummy portion being insulated from the extension portion, wherein the dummy portion has a larger electrical conductivity than that of the resistance portion, wherein the dummy portion is on top of the resistance portion.

13. The input pad as claimed in claim 12, further comprising
an insulating layer on the dummy portion,
wherein the resistance portion contacts the extension portion through first contact holes in the insulating layer and contacts the connection portion through second contact holes in the insulating layer, and wherein the dummy portion contacts the connection portion through third contact holes in the insulating layer.

14. The input pad as claimed in claim 13, wherein each of the first contact holes corresponds to a first edge portion of the resistance portion, each of the second contact holes corresponds to a second edge portion of the resistance portion, and the first and second edge portions of the resistance portion being opposite each other.

15. The input pad as claimed in claim 14, wherein the first contact holes are adjacent to each other along a direction in which the first edge portion extends, and the second contact holes are adjacent to each other along a direction in which the second edge portion extends.

16. The input pad as claimed in claim 14, wherein the third contact holes are disposed between the first contact holes and the second contact holes, the third contact holes being adjacent to the second contact holes.

17. The input pad as claimed in claim 16, wherein the third contact holes are adjacent to each other along a direction in which either the first edge portion or the second edge portion extends.

18. The input pad as claimed in claim 12, wherein
the resistance portion includes polysilicon, and
the dummy portion includes metal.

19. An input pad comprising:
a plurality of wiring connected to a unit, the input pad including,
an extension portion extending from a wiring, the extension portion being
greater than the wiring, a connection portion connected to a circuit board,
a resistance layer, disposed directly on a surface of a substrate, contacting the extension portion and the connection portion,
a dummy layer on the resistance layer, the dummy layer being insulated from the extension portion and contacting the connection portion, and
a first contact hole for the extension portion and second and third contact holes for the connection portion, wherein the first contact hole and the second contact hole directly expose the resistance layer and the third contact hole directly exposes the dummy layer, wherein the dummy layer is on top of the resistance layer.

* * * * *